United States Patent
Yabu

(10) Patent No.: US 9,891,525 B2
(45) Date of Patent: Feb. 13, 2018

(54) EXPOSURE METHOD, EXPOSURE APPARATUS, AND ARTICLE MANUFACTURING METHOD

(71) Applicant: CANON KABUSHIKI KAISHA, Tokyo (JP)

(72) Inventor: Nobuhiko Yabu, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 180 days.

(21) Appl. No.: 14/927,605

(22) Filed: Oct. 30, 2015

(65) Prior Publication Data

US 2016/0124318 A1 May 5, 2016

(30) Foreign Application Priority Data

Nov. 5, 2014 (JP) .................. 2014-224877

(51) Int. Cl.
G03F 7/20 (2006.01)

(52) U.S. Cl.
CPC ............ *G03F 7/2022* (2013.01); *G03F 7/706* (2013.01); *G03F 7/70091* (2013.01); *G03F 7/70483* (2013.01)

(58) Field of Classification Search
CPC ............... G03F 7/2022; G03F 7/70091; G03F 7/70483; G03F 7/706
USPC .......................................... 430/30, 328, 394
See application file for complete search history.

(56) References Cited

U.S. PATENT DOCUMENTS

| | | | |
|---|---|---|---|
| 5,661,546 A | 8/1997 | Taniguchi | |
| 6,333,777 B1 | 12/2001 | Sato | |
| 6,768,546 B2 | 7/2004 | Sato | |
| 7,111,943 B2 | 9/2006 | Agostinelli et al. | |
| 7,538,952 B2 | 5/2009 | Uitterdijk et al. | |
| 7,619,716 B2 | 11/2009 | Kawashima et al. | |
| 8,618,516 B2 | 12/2013 | Ito | |
| 2006/0215143 A1 | 9/2006 | Yamaguchi et al. | |

FOREIGN PATENT DOCUMENTS

| | | |
|---|---|---|
| CN | 101109909 A | 1/2008 |
| CN | 102253606 A | 11/2011 |
| JP | H06029179 A | 2/1994 |
| JP | 2828226 B2 | 11/1998 |
| JP | 3395280 B2 | 4/2003 |
| JP | 2014007262 A | 1/2014 |
| KR | 1020080020599 A | 3/2008 |

OTHER PUBLICATIONS

Office Action issued in Chinese Appln. No. 201510731070 dated Mar. 21, 2017. English translation provided.
Notice of Allowance issued in Taiwanese Appln. No. 104134363, dated Nov. 8, 2016.
Office Action issued in Korean Application No. 10-2015-0145147 dated Sep. 18, 2017. English translation provided.

*Primary Examiner* — Christopher G Young
(74) *Attorney, Agent, or Firm* — Rossi, Kimms & McDowell LLP

(57) ABSTRACT

This exposure method comprises a first step of performing the exposure processing by irradiating a projection optical system (the system) by a first pupil plane illumination distribution (the first distribution) of the system; a second step of performing the exposure processing by irradiating the system by a second pupil plane illumination distribution (the second distribution) that is different from the first distribution, after the first step; a change amount obtaining step of obtaining a change amount of an imaging performance of the system in a condition of the second distribution, with respect to the imaging performance in the first step; and a correction amount obtaining step of obtaining a correction amount for correcting the imaging performance in the second step, by using the change amount, wherein, in the second step, the exposure processing is performed by correcting the imaging performance using the correction amount.

12 Claims, 7 Drawing Sheets

EXPOSURE METHOD, EXPOSURE APPARATUS, AND ARTICLE MANUFACTURING METHOD

BACKGROUND OF THE INVENTION

Field of the Invention

The present invention relates to an exposure method, an exposure apparatus, and an article manufacturing method.

Description of the Related Art

Various devices, for example, a semiconductor device and a flat panel display (liquid crystal display device) are manufactured through a photolithography process. The photolithography process includes an exposure process in which a pattern of an original referred to as a "mask" or a "reticle" is projected and exposed to a substrate such as a glass plate or a wafer coated with photosensitizer referred to as "resist". In recent years, improvement of the focus accuracy, which indicates accuracy of matching a substrate surface with an imaging plane of a projection optical system, and improvement of alignment accuracy, which indicates accuracy of accurately superposing pattern layers formed through a plurality of processes, and the like have been important in order to improve exposure accuracy so as to meet a demand for further miniaturization of the pattern.

In this context, when an exposure light is continuously irradiated to the projection optical system for a long time, heat is generated by absorbing a part of the exposure energy, and as a result, imaging performance (focus, magnification, distortion, astigmatism, wave front aberration, etc.) changes, and focus and alignment errors that cannot be ignored may occur. In contrast, an exposure method that successfully adjusts the change of the imaging performance even when an illumination condition of the exposure light changes and the heat-generation distribution of a lens in the projection optical system changes, has been proposed. Japanese Patent No. 2828226 discloses an exposure method in which a correction coefficient of the imaging performance corresponding to a light source image distribution state of the illumination light is stored, corresponding correction information is read out when the light source image distribution state is changed, and the correction is performed on the basis of the information. However, in the exposure method disclosed in the Japanese Patent No. 2828226, immediately after the change of the illumination condition, the temperature distribution occurring due to the illumination conditions before the change remains in the projection optical system. Thus, there may be cases where an offset in accordance with the amount of influence of the absorption of the illumination light before the change occurs in the imaging performance under the illumination condition after the change. Accordingly, Japanese Patent No. 3395280 discloses an exposure method in which the occurrence of the offset of the imaging performance immediately after the change of the illumination condition is eliminated by correcting the correction amount of the imaging performance on the basis of an accumulated energy amount according to the illumination condition before the change.

In this context, when the exposure is continued under the illumination condition after the change, the temperature distribution in the lens in the vicinity of a pupil plane of the projection optical system becomes a transient state in which the influence under the illumination condition before the change and the influence under the illumination condition after the change are overlapped. In contrast, in the exposure method disclosed in the Japanese Patent No. 3395280, because the correction amount of the imaging performance is corrected by focusing only on the offset amount immediately after the change of the illumination condition, it is difficult to accurately calculate the change amount in such a transient state.

In contrast, for example, there is a method for performing exposure while controlling the imaging performance of the projection optical system under a new illumination condition, after stopping the exposure until influence of the change amount of the imaging performance becomes small when the illumination condition is changed corresponding to the original or its pattern. Here, "until influence of the change amount of the imaging performance becomes small" refers to the point at which the change amount of the imaging performance, which is due to absorption of the illumination light of the projection optical system under the illumination condition before the change, becomes a predetermined allowable value or less. This can also be called the point in time at which the influence on the imaging performance of the energy amount accumulated in the projection optical system before the change becomes negligible. According to this method, exposure is not performed under the transient state when the illumination condition is changed, and thus, the imaging performance of the projection optical system can be strictly controlled for each illumination condition. However, in this method, because it is necessary to stop the exposure each time the illumination condition and the pattern of the original (that is, illumination distribution in the pupil plane of the projection optical system (light source image distribution) changes)), throughput of the exposure apparatus decreases. Additionally, as another method, in the transient state after the change of the illumination condition, it is assumed that exposure is performed while successively measuring the imaging performance of the projection optical system by using a reference mark on a stage that holds the substrate, and correcting the imaging performance as needed based on this measurement result. However, it is necessary to perform the measurement of the imaging performance after temporarily stopping the exposure also in this method, and a decrease of the throughput cannot be avoided.

SUMMARY OF THE INVENTION

The present invention provides, for example, an exposure method that is advantageous in improving exposure accuracy.

The present invention is an exposure method that performs exposure processing in which light from a light source is irradiated to an original, a pattern of the original is projected to a substrate via a projection optical system to expose the substrate, comprising: a first exposure step of performing the exposure processing by irradiating the projection optical system by a first pupil plane illumination distribution of the projection optical system; a second exposure step of performing the exposure processing by irradiating the projection optical system by the second pupil plane illumination distribution that is different from the first pupil plane illumination distribution, after the first exposure step; a change amount obtaining step of obtaining a change amount of an imaging performance of the projection optical system in a condition of the second pupil plane illumination distribution, with respect to the imaging performance of the projection optical system in the first exposure step in which the irradiation is performed in the first pupil plane illumination distribution; and a correction amount obtaining step of obtaining a correction amount for correcting the imaging performance of the projection optical system in the second exposure step, by using the change amount obtained in the change amount obtaining step, wherein, in the second exposure step, the exposure processing is performed by correcting the imaging performance of the projection optical system using the obtained correction amount.

Further features of the present invention will become apparent from the following description of exemplary embodiments with reference to the attached drawings.

DESCRIPTION OF THE EMBODIMENTS

Hereinafter, embodiments for performing the present invention will be described with reference to drawings and the like.

First, a description will be given of a configuration of an exposure apparatus according to one embodiment of the present invention. The exposure apparatus is an apparatus that exposes a pattern formed on an original such as a reticle onto a substrate to be treated by a step-and-step method or a step-and-repeat method, and in the present invention, the exposure method is not particularly limited. Hereinafter, as an example, the exposure apparatus according to the present embodiment is a projection exposure apparatus used in a lithography process in the manufacturing process of a semiconductor device, and that exposes (transfers) an image of the pattern formed on a reticle R onto a wafer W (onto the substrate) by a scanning exposure method.

Figure 1:
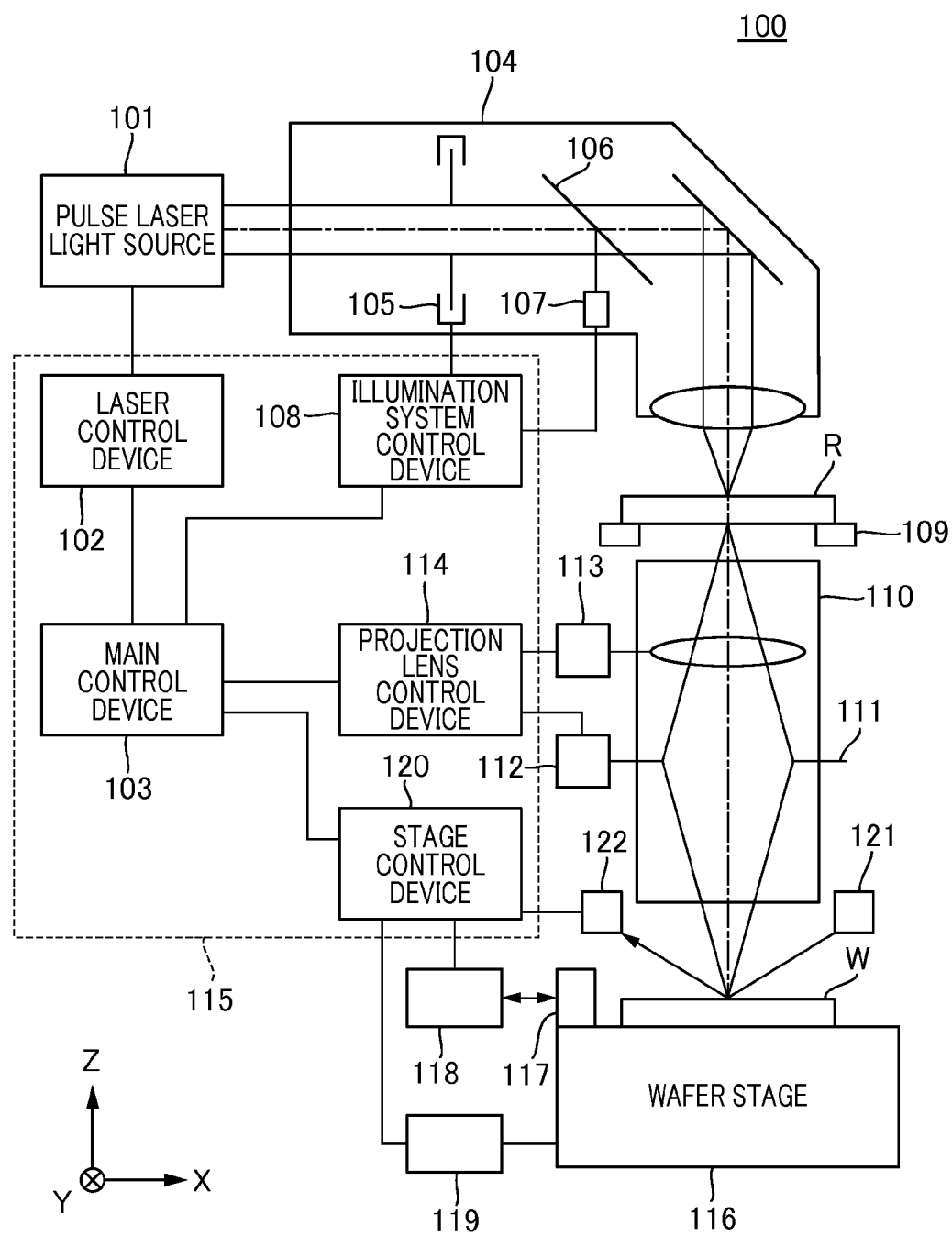
FIG. 1 illustrates a configuration of an exposure apparatus according to one embodiment of the present invention.

FIG. 1 is a schematic diagram illustrating a configuration of an exposure apparatus 100 according to the present embodiment. Note that, in each drawing, the Z-axis is parallel to the optical axis of a projection optical system 110, the Y-axis is in a scanning direction of the wafer W during exposure in the same plane perpendicular to the Z-axis (or the relative moving direction between the reticle R and the wafer W), and the X-axis is in the non-scanning direction orthogonal to the Y-axis. The exposure apparatus 100 includes an illumination optical system 104, a reticle stage 109, a projection optical system 110, a wafer stage 116, and a control unit 115.

The illumination optical system 104 adjusts a luminous flux from a laser light source 101, and illuminates the reticle R. The laser light source 101 is, for example, a pulse laser light source that emits a laser light and is filled with gas such as KrF or ArF. Additionally, the laser light source 101 includes a front mirror that configures a resonator, a diffraction grating that narrows exposure wavelength, a narrowing module including a prism or the like, a monitor module including a spectrometer and a detector that monitors the stability of the wavelength and spectral width, and a shutter. A beam emitted from the laser light source 101 is shaped into a predetermined beam shape by a beam shaping optical system (not illustrated) under the illumination optical system 104, incident to an optical integrator (not illustrated), and a plurality of secondary light sources for illuminating the reticle R with a uniform illumination distribution is formed. Additionally, the illumination optical system 104 includes an aperture diaphragm 105, a half mirror 106, and a photo sensor 107. The aperture diaphragm 105 has a substantially circular-shaped opening, and can set not only the diameter of the opening but also the number of the openings (NA) of the illumination optical system 104 to a desired value. Here, the aperture diaphragm 105 can form annular illumination if the opening is formed so as to have an annular shape. The half mirror 106 is disposed on the optical path of the illumination optical system 104, and reflects and removes a part of the exposure light that illuminates the reticle R. The photo sensor 107 is a detector for ultraviolet lights, and outputs a value that can lead exposure energy (the intensity of the exposure light) based on the light reflected and removed by the half mirror 106. Specifically, the output of the photo sensor 107 is converted to the exposure energy per one pulse by an integration circuit (not illustrated) that performs integration for each pulse emission from the laser light source 101.

The reticle R is, for example, a quartz glass original, formed with a pattern to be transferred to the wafer W (for example, a circuit pattern). The reticle stage (original holder) 109 is movable in each of the X and Y axial directions while holding the reticle R. The projection optical system 110 projects light passed through the reticle R (circuit pattern image) onto the wafer W at a predetermined magnification R (for example, ¼ times). Additionally, the projection optical system 110 includes an aperture diaphragm 111 and a lens drive device 113. The aperture diaphragm 111 has a substantially circular shaped opening, disposed on the pupil plane of the projection optical system 110 (Fourier transform plane with respect to the reticle R), and a drive unit 112 such as a motor can adjust the diameter of the opening. The lens drive device (optical element drive unit) 113 allows a field that configures a part of a lens (optical element) system in the projection optical system 110 to move along the optical axis of the projection optical system 110 by using, for example, air pressure or a piezoelectric element, or allows deforming the lens itself.

The wafer W is a substrate made of, for example, monocrystalline silicon, coated with a resist (photosensitizer) on the surface. The wafer stage (substrate holder) 116 holds the wafer W via a wafer chuck (not illustrated), and is movable in each of the X, Y, and Z axial directions (ωx, ωy, ωz that are respective rotational directions thereof may be included). The XY plane position of the wafer stage 116 is determined at a laser interferometer 118 by measuring the distance from a moving mirror 117 that is fixed to the wafer stage 116. The plane position of the wafer W in the optical axis direction (focus plane position) is determined by the measurement by a focus detection device. The focus detection device includes a light projection optical system 121 and a detection optical system 122. The light projection optical system 121 projects a plurality of luminous fluxes consisting of non-exposure light that does not expose the resist onto the wafer W. Each luminous flux is focused on the wafer W and reflected, and the detection optical system 122 detects the luminous flux reflected on the wafer W. The detection optical system 122 includes a plurality of position detection light receiving elements (not illustrated) corresponding to each reflected luminous flux, and is configured such that the light receiving surface of the light receiving element and the reflection point of each luminous flux on the wafer W become substantially conjugated by an imaging optical system (not illustrated). Subsequently, the surface positional shift of the wafer W in the optical axis direction of the projection optical system 110 is measured as a positional shift of the incident luminous flux on the light receiving element.

The control unit 115 is configured by, for example, a computer, connected to each element of the exposure apparatus 100 via a line, and can control the operation and adjustment of each element in accordance with a program, and the like. The control unit 115 includes a main control device 103, a laser control device 102, an illumination system control device 108, a projection lens control device 114, and a stage control device 120. The main control device 103 is connected to each control device in the control unit 115, and performs the control of the entire exposure apparatus 100. The laser control device 102 executes, for example, the gas exchange operation control of the laser light source 101, the control for wavelength stabilization, or the control of a discharge applying voltage. Note that, in the present embodiment, these controls are not single controls directed only by the laser control device 102, and shall be executed by the direction from the main control device 103. The illumination system control device 108 is one of the switching units that enables switching a plurality of illumination conditions (the number of openings of the illumination optical system 104, the number of openings of the projection optical system 110, the annular illumination, oblique illumination, and the like), and controls the diameter of the opening of the aperture diaphragm 105 under the illumination optical system 104. Here, because a value of ratio of the number of openings of the illumination optical system 104 with respect to the number of openings of the projection optical system 110 is a coherence factor (G value), the illumination system control device 108 can set G value by controlling the diameter of the opening. Note that, as a switching unit, in addition, there is a mechanism (control device) that changes the reticle R having a different pattern shape, or changes the irradiation area of the reticle R. Additionally, the illumination system control device 108 transmits the value of the exposure energy converted based on the output of the photo sensor 107 to the main control device 103. The projection lens control device 114 calculates the change of the imaging performance of the projection optical system 110 based on a model formula described below, and determines the amount to be corrected. The lens drive device 113 drives the lens in the projection optical system 110 based on the correction amount determined by the projection lens control device 114, and can suppress the change of the imaging performance of the projection optical system 110. The stage control device 120 makes the laser interferometer 118 detect the position of the wafer stage 116, controls a drive device 119 such as a motor, and moves the wafer stage 116 to a predetermined XY plane position.

Next, a description will be given of a model formula for the imaging performance change of the projection optical system 110 caused by the exposure in the present embodiment (irradiation of exposure light to the projection optical system 110 by the laser light source 101), and a correction amount to be used to quantify the model formula (correction coefficient). In this context, examples of the imaging performance of the projection optical system 110 include focus, magnification, distortion aberration (distortion), astigmatism, or field curvature.

Figure 2:
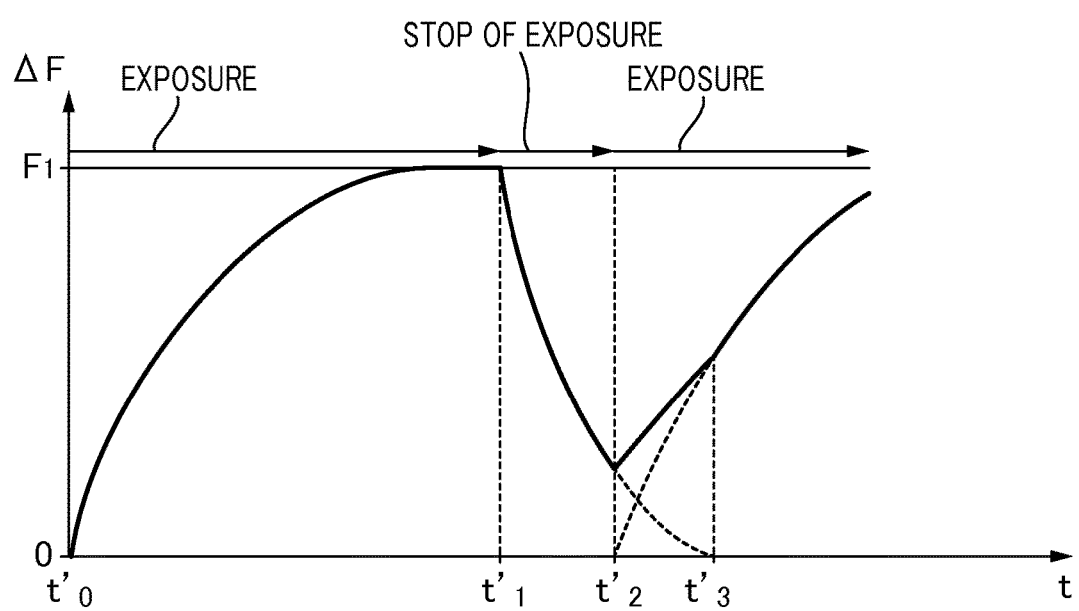
FIG. 2 is a graph illustrating a change with the passage of time of the imaging performance of a projection optical system due to the exposure.

FIG. 2 is a graph that exemplifies a typical change with the passage of time (change characteristic) of the imaging performance of the projection optical system due to the exposure. In FIG. 2, the horizontal axis indicates time t, the vertical axis indicates a change amount $\Delta F$ of the imaging performance in an image height of the projection optical system. Note that the change amount $\Delta F$ is different for each image height. First, when the exposure starts from time $t_0$ as setting the initial change amount $\Delta F$ of the projection optical system to zero, the imaging performance changes with time, and eventually stabilizes at a constant value (the maximum change amount) F1. This state indicates that energy is absorbed in the projection optical system and becomes heat, and heat energy released from the projection optical system reach an equilibrium state, and subsequently, even if exposure light is continuously irradiated, the change amount $\Delta F$ does not change from the maximum change amount F1. Subsequently, when the exposure stops, the change amount $\Delta F$ decreases with time, and eventually returns to the initial value zero.

Here, the maximum change amount F1 is represented by formula (1) by the using change amount (exposure coefficient) K of the imaging performance per unit light amount (unit exposure energy) and actual exposure energy Q calculated based on various conditions including the exposure amount, the scanning speed, or the exposure area information.

$$F1 = K \times Q \tag{1}$$

First, in a case where the exposure starts from time $t'_0$, the change amount $\Delta F(t)$ of the imaging performance after time $t'_0$ is approximated as in formula (2) by using the maximum change amount F1 and time constant T1 that represents the speed of heating.

$$\Delta F(t) = F1 \times (1 - \exp(-(t - t'_0)/T1)) \tag{2}$$

Additionally, the change after stopping the exposure at time $t'_1$ is approximated as in formula (3) by using $\Delta F(t'_1)$ at time $t'_1$ and the time constant T2 that represents the speed of heat release.

$$\Delta F(t) = \Delta F(t'_1) \times \exp(-(t - t'_1)/T2) \tag{3}$$

Moreover, in a case where the exposure resumes at time $t'_2$, the change after time $t'_2$ is represented by formula (4).

$$\Delta F(t) = \Delta F(t'_1) \times \exp(-(t - t'_1)/T2) + F1 \times (1 - \exp(-(t - t'_2)/T1)) \tag{4}$$

Here, the first term on the right side of the formula (4) is the same as the right side of the formula (3). Additionally, with regards to the second term on the right side of the formula (4), $t'_2$ is given instead of $t'_0$ in the right side of the formula (2). That is, it is possible to take into consideration the formula (4) as a linear sum of a tendency of releasing heat of the lens in the projection optical system after time $t'_1$ and a tendency of heating of the lens after time $t'_2$. Additionally, in a case where time $(t - t'_1)$ is sufficiently large, the formula (4) is consistent with the formula (2) because the first term on the right side is negligible. This means that the influence of heat caused by the exposure is negligible if a sufficient time has elapsed after the completion of the exposure.

Accordingly, it is possible to predict the change of the imaging performance of the projection optical system caused by the exposure by modeling the change characteristic curves shown in FIG. 2 by using a function shown in the formulae (1) to (4). However, the formulas (1) to (4) are examples, and modeling may be carried out by using another approximation.

Additionally, the change amount K of the imaging performance per unit light amount described above, and the time constants T1 and T2 change depending on the exposure conditions. This is because, in different exposure conditions, the distributions of the energy density of light that is incident to the projection optical system (see FIGS. 3A and B below) are different, as a result, distribution of the temperature change and time characteristic of the projection optical system change, so that the change amount and time characteristic of the imaging performance also change. Here, as the exposure conditions, for example, there are illumination conditions, the pattern of the reticle R (presence or absence of a phase shifter, periodicity, fineness, etc.), or the illumination area of the reticle.

In contrast, when the illumination conditions are different, not only the temperature distribution occurring in the lens in the projection optical system, but also the influence of the temperature distribution on the imaging performance is different. That is, when the illumination conditions are different, even if the temperature distributions of the lens are identical, the degrees of the influences on the imaging performance are different. This is because the influence of the temperature distribution of the lens on the imaging performance changes depending on the part of the lens through which the luminous flux passes. Hereinafter, as an example, a case in which the exposure apparatus is used by switching between two types of illumination conditions, that is, an illumination condition A that corresponds to a condition in which there is a first pupil plane illumination distribution in the projection optical system 110, and an illumination condition B that corresponds to a condition in which there is a second pupil plane illumination distribution in the projection optical system 110, will be assumed.

Figure 3A:
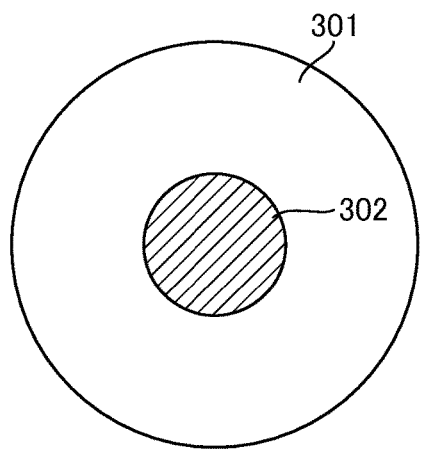
FIG. 3A illustrates a pupil plane illumination distribution of the projection optical system for each illumination condition.
Figure 3B:
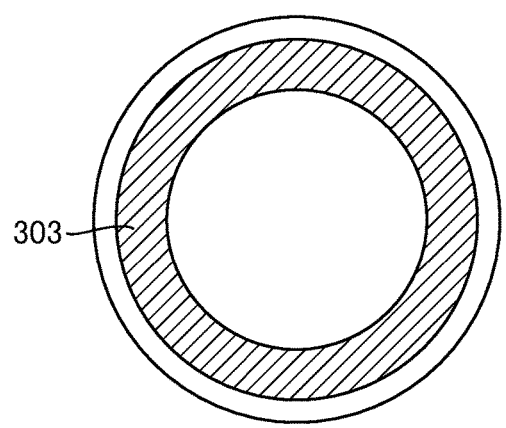
FIG. 3B illustrates a pupil plane illumination distribution of the projection optical system for each illumination condition.

First, a description will be given of the difference of each illumination condition. FIG. 3 is a schematic diagram illustrating the pupil plane illumination distribution (energy density distribution of light on the pupil plane) of the projection optical system 110 with respect to each illumination condition, wherein FIG. 3A illustrates the first pupil plane illumination distribution according to the illumination condition A, and FIG. 3B illustrates a second pupil plane illumination distribution according to the illumination condition B. In the drawings, an area 301 indicates a pupil area of the projection optical system 110. An area 302 indicates an area where light mainly passes through in a case where the exposure processing under the illumination condition A (first exposure processing) is performed. Additionally, an area 303 indicates an area where light mainly passes through in a case where the exposure processing under the illumination condition B (second exposure processing) is performed. Note that the illumination condition A is what is referred to as conventional illumination, and the illumination condition B is what is referred to as annular illumination.

Figure 4A:
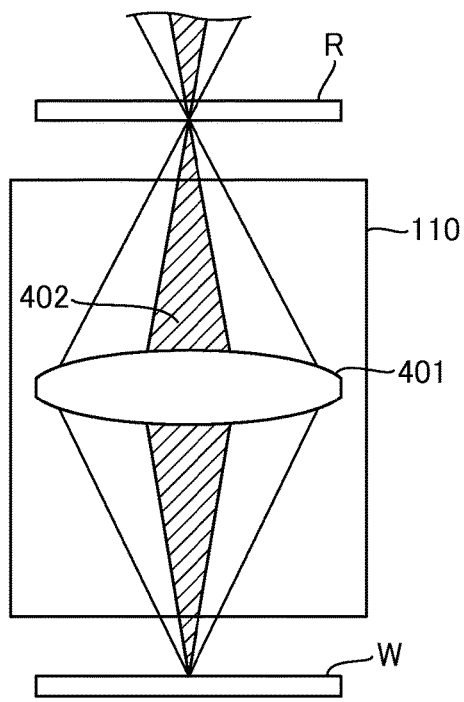
FIG. 4A illustrates a luminous flux for each illumination condition.
Figure 4B:
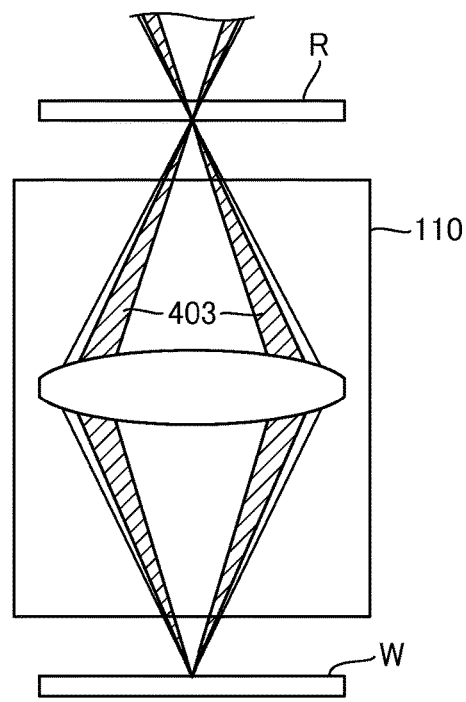
FIG. 4B illustrates a luminous flux for each illumination condition.

FIGS. 4A and 4B are schematic diagrams illustrating the difference of the passing position of luminous flux in the projection optical system 110 according to each illumination condition, wherein FIG. 4A illustrates the luminous flux under the illumination condition A, and FIG. 4B illustrates the luminous flux under the illumination condition B. Note that, in the projection optical system 110, optical elements other than a lens 401 near the pupil are not illustrated. First, under the illumination condition A, in the lens 401, because a luminous flux 402 passes through the central portion of the lens, the central portion of the lens is heated during exposure. Additionally, the temperature distribution of this portion influences the imaging performance. In contrast, the temperature distribution of the lens periphery where the luminous flux does not pass thorough does not influence the imaging performance (or hardly influences it). Next, under the illumination condition B, in the lens 401, because a luminous flux 403 passes through the lens periphery, the lens periphery is heated during exposure. Additionally, the temperature distribution of this portion influences the imaging performance. In contrast, the temperature distribution of the central portion of the lens where the luminous flux does not pass through does not influence the imaging performance (or hardly influences it). Accordingly, the heated portion of the lens is different between the illumination condition A and the illumination condition B. Additionally, the portions of the lens influencing the imaging performance are different. Note that, although the lens 401 near the pupil of the projection optical system 110 is emphasized here, even in the optical elements other than the lens 401, areas where the luminous flux passes through are different depending under the illumination conditions in a similar way.

Figure 5:
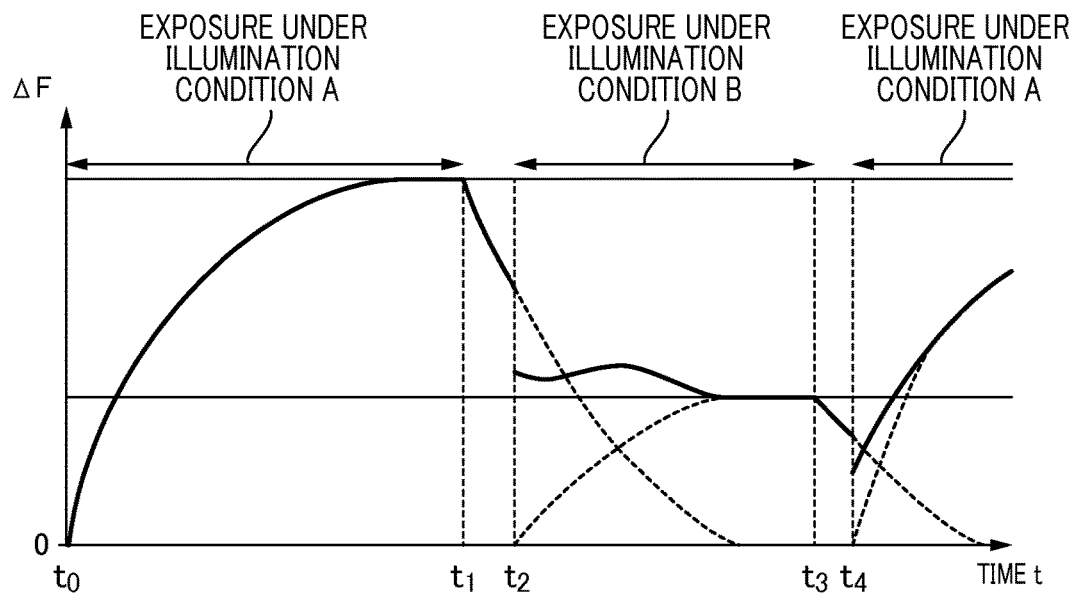
FIG. 5 is a graph illustrating the change of the imaging performance in one embodiment.

Next, a specific description will be given of a method of performing exposure while switching between two types of the illumination conditions. FIG. 5 is a graph illustrating a change with the passage of time (change characteristic) of the imaging performance of the projection optical system due to the exposure while switching the illumination conditions. In FIG. 5, the horizontal axis indicates time t, the vertical axis indicates the change amount ΔF of the imaging performance in an image height of the projection optical system. Here, the exposure is performed under the illumination condition A in a section between time $t_0$ and $t_1$, performed under the illumination condition B in a section between time $t_2$ and $t_3$, and performed under the illumination condition A again in a section from time $t_4$. Additionally, the exposure temporarily stops in order to switch the illumination conditions, in the section between time $t_1$ and $t_2$, and in the section between time $t_3$ and $t_4$.

Here, in the section of $t_0 \leq t < t_2$, the change amount ΔF can be calculated by using the formulas (2) and (3). However, the change amount ΔF discontinuously changes at the moment of the change from the illumination condition A to the illumination condition B at the time $t_2$. This discontinuity is due to the offset that occurs in response to the amount influenced by the absorption of the illumination light before the change when the area of the lens where the luminous flux passes through is switched. Moreover, the lens temperature distribution after the time $t_2$ transitions to a state in which a tendency of releasing heat of the temperature distribution caused under the illumination condition A and a tendency of heating thereof caused under the illumination condition B are overlapped. Originally, the change of the imaging performance in a state in which the tendency of releasing heat and the tendency of heating are overlapped can be represented by a linear sum of heat release characteristics of the imaging performance change represented by the formula (3) and the heating characteristic of the imaging performance change represented by the formula (2). Therefore, the change in the imaging performance after the time $t_2$ can be accurately determined by respectively determining both characteristics.

Here, the change amount $\Delta F$ after the time $t_2$ must take into consideration the influence of the lens temperature distribution in the area where the luminous flux under the illumination condition B passes through. Accordingly, the heat release characteristic of the imaging performance change caused under the illumination condition A should also be the subject of evaluation with respect to the lens temperature distribution of the area where the luminous flux under the illumination condition B passes through. However, although the change amount $\Delta F$ in the section of $t_0 \leq t < t_2$ shown in FIG. 5 takes into consideration the influence of the lens temperature distribution in the area where the luminous flux under the illumination condition A passes through, it does not take into consideration the influence of the lens temperature distribution in the area where the luminous flux under the illumination condition B passes through. Hence, it is impossible to determine the heat release characteristic of the imaging performance change caused under the illumination condition A after switching the illumination at the time $t_2$, consequently, it is impossible to accurately determine the change amount $\Delta F$ after the time $t_2$. Note that the same applies when the illumination conditions are changed from the illumination condition B to the illumination condition A at the time $t_4$. This means that the change amount $\Delta F$ of the imaging performance while switching the illumination conditions cannot be accurately determined only by the calculation models represented by the formulas (1) to (4).

Accordingly, in the present embodiment, the change in the imaging performance is taken into consideration by using two models: a first model that represents the influence on the imaging performance of the temperature distribution with respect to the luminous flux under the illumination condition A, and a second model that represents the influence on the imaging performance of the temperature distribution with respect to the luminous flux under the illumination condition B. The reason that the change amount $\Delta F$ of the imaging performance while switching the illumination conditions cannot be accurately determined only by the above calculation models is due to the fact that the lens area of the projection optical system where the luminous flux passes through are different depending under the illumination conditions. That is, the change amount $\Delta F$ in the section of $t_0 \leq t < t_2$, and the change amount $\Delta F$ in the section of $t_2 \leq t < t_4$ represent the influence of the temperature distribution in the different lens areas, and they respectively change according to different models. Accordingly, when the calculation model is divided for each illumination condition, the continuity of the calculation model can be maintained even after changing the illumination conditions. Hereinafter, as an example, a variable unit that makes the imaging performance of the projection optical system 110 variable serves as the lens drive device 113, and the projection lens control device 114 serving as a change amount deriving process derives the change amount $\Delta F$ of the projection optical system 110 as described below. However, the variable unit that makes the imaging performance of the projection optical system 110 variable is not limited to the lens drive device 113, and the reticle stage 109 or the wafer stage 116 may be used and, for example, the main control device 103 may execute the change amount deriving process.

Figure 6:
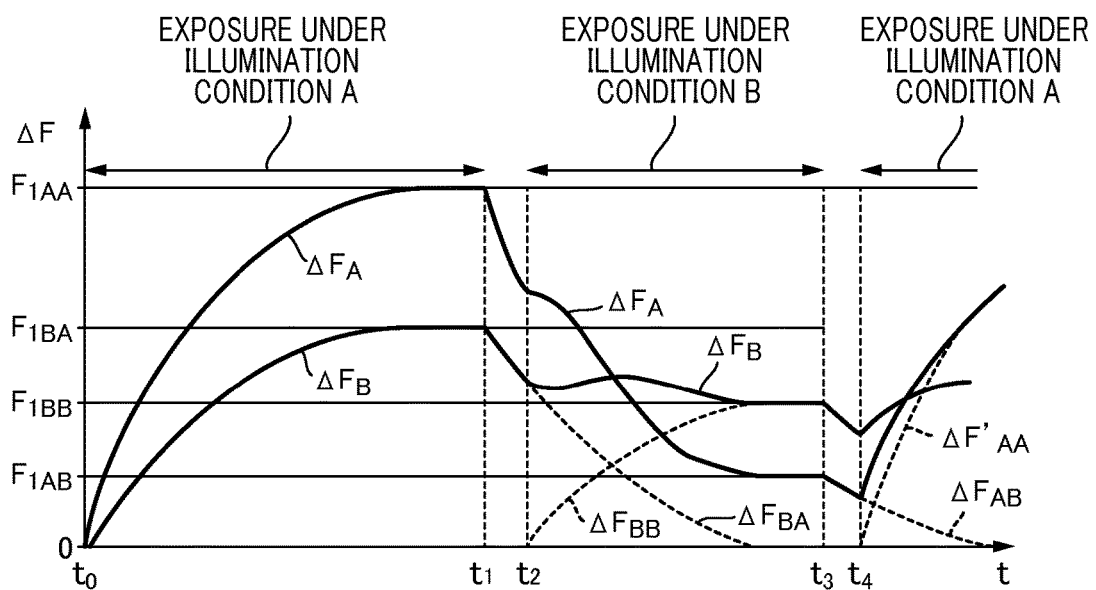
FIG. 6 is a graph illustrating a calculation model of the change of the imaging performance in one embodiment.

FIG. 6 is a graph that illustrates a calculation model (imaging performance model) that represents the change with the passage of time of the imaging performance of the projection optical system 110 due to the exposure in the present embodiment. Note that performing exposure while switching between two types of the illumination conditions is the same as precondition in FIG. 5. In the drawing, $\Delta F_A$ shown by solid lines is a first change amount that represents the influence on the imaging performance of the temperature distribution with respect to the luminous flux under the illumination condition A, that is, the first model in the present embodiment. In contrast, $\Delta F_B$ also shown by solid lines is a second change amount that represents the influence on the imaging performance of the temperature distribution with respect to the luminous flux under the illumination condition B, that is, a second model in the present embodiment. Note that, at the time $t_0$, the change amounts $\Delta F_A$ and $\Delta F_B$ are both zero.

First, each of the change amounts $\Delta F_A$ and $\Delta F_B$ in the section in which the exposure processing is performed under the illumination condition A from the time $t_0$ to $t_1$ ($t_0 \leq t \leq t_1$) (first exposure process) are represented by formulae (5) and (6), based on the formula (2).

$$\Delta F_A(t) = \Delta F_{AA}(t) = F1_{AA} \times (1 - \exp(-(t-t_0)/T1_{AA})) \qquad (5)$$

$$\Delta F_B(t) = \Delta F_{BA}(t) = F1_{BA} \times (1 - \exp(-(t-t_0)/T1_{BA})) \qquad (6)$$

Here, $\Delta F_{XY}$ represents the influence of the temperature distribution caused under the illumination condition Y on the imaging performance with respect to the luminous flux of the illumination condition X. Here, the change amount $\Delta F_A$ is calculated using two parameters, $F1_{AA}$ and $T1_{AA}$, as represented by the formula (5). In contrast, the change amount $\Delta F_B$ is calculated using two parameters, $F1_{BA}$ and $T1_{BA}$, as represented by the formula (6). As such, the change amount $\Delta F_A$ and the change amount $\Delta F_B$ are calculated by different parameters. This is because this reflects that the lens portions that influence the imaging performance are different for each illumination condition.

Next, each of the change amounts $\Delta F_A$ and $\Delta F_B$ in the exposure stop section between the time $t_1$ and $t_2$ ($t_1 < t < t_2$) is represented by formulas (7) and (8) based on the formula (3).

$$\Delta F_A(t) = \Delta F_{AA}(t) \qquad (7)$$
$$= \Delta F_{AA}(t_1) \times \exp(-(t-t_1)/T2_{AA})$$

$$\Delta F_B(t) = \Delta F_{BA}(t) \qquad (8)$$
$$= \Delta F_{BA}(t_1) \times \exp(-(t-t_1)/T2_{BA})$$

As shown in the formulae (7) and (8), the change amount $\Delta F_A$ and the change amount $\Delta F_B$ are calculated by different parameters ($T2_{AA}$ and $T2_{BA}$).

Next, the change amounts $\Delta F_A$ and $\Delta F_B$ in the section where exposure processing is performed under the illumination condition B between the time $t_2$ and $t_3$ ($t_2 < t \leq t_3$) (second exposure process) are represented by formula (9) and (10) respectively.

$$\Delta F_A(t) = \Delta F_{AA}(t) + \Delta F_{AB}(t) \qquad (9)$$

$$\Delta F_B(t) = \Delta F_{BA}(t) + \Delta F_{BB}(t) \qquad (10)$$

However, $\Delta F_{AA}$ and $\Delta F_{AB}$ are represented by formulas (11) and (12) respectively.

$$\Delta F_{AA}(t) = \Delta F_{AA}(t) \times \exp(-(t-t_1)/T2_{AA}) \qquad (11)$$

$$\Delta F_{AB}(t) = F1_{BB} \times (1 - \exp(-(t-t_2)/T1_{AB})) \qquad (12)$$

In contrast, $\Delta F_{BA}$ and $\Delta F_{BB}$ are respectively represented by formulae (13) and (14).

$$\Delta F_{BA}(t) = \Delta F_{BA}(t_1) \times \exp(-(t-t_1)/T2_{BA}) \quad (13)$$

$$\Delta F_{BB}(t) = F1_{BB} \times (1 - \exp(-(t-t_2)/T1_{BB})) \quad (14)$$

Here, in a manner similar to $\Delta F_{AA}$ in the formula (7), $\Delta F_{AA}$ in the formula (11) represents the tendency of decreasing the temperature distribution under the illumination condition A after the time $t_1$. In contrast, $\Delta F_{AB}$ in the formula (12) represents the tendency of increasing the temperature distribution under the illumination condition B after the time $t_2$. Subsequently, the change amount $\Delta F_A$ is represented by a linear sum thereof. The reason for the establishment of this linear sum is that $\Delta F_{AA}$ and $\Delta F_{AB}$ both represent the influence on the luminous flux under the illumination condition A. Additionally, $\Delta F_{BA}$ in formula (13) represents the tendency of decreasing temperature distribution under the illumination condition A after the time $t_1$, in a manner similar to $\Delta F_{BA}$ in the formula (8). In contrast, $\Delta F_{BB}$ in the formula (14) represents the tendency of increasing the temperature distribution under the illumination condition B after the time $t_2$. Subsequently, the change amount $\Delta F_B$ is represented by these linear sums. The reason for the establishment of this linear sum is that $\Delta F_{BA}$ and $\Delta F_{BB}$ both represent the influence on the luminous flux under the illumination condition B. Note that $\Delta F_{BA}$ and $\Delta F_{BB}$ in the section of $t_2 < t \le t_3$ are shown by dashed lines in FIG. 6. Thus, if the imaging performance with respect to the luminous flux under the illumination condition A and the imaging performance with respect to the luminous flux under the illumination condition B are handled as different models, the change of the imaging performance can be accurately determined even after changing the illumination conditions.

Next, each of the change amounts $\Delta F_A$ and $\Delta F_B$ in the exposure stop section from the time $t_3$ to $t_4$ ($t_3 < t \le t_4$) is represented by formulas (15) and (16).

$$\Delta F_A(t) = \Delta F_{AA}(t) + \Delta F_{AB}(t) \quad (15)$$

$$\Delta F_B(t) = \Delta F_{BA}(t) + \Delta F_{BB}(t) \quad (16)$$

However, $\Delta F_{AA}$ and $\Delta F_{AB}$ are represented by formulae (17) and (18) respectively.

$$\Delta F_{AA}(t) = \Delta F_{AA}(t_1) \times \exp(-(t-t_1)/T2_{AA}) \quad (17)$$

$$\Delta F_{AB}(t) = \Delta F_{AB}(t_3) \times \exp(-(t-t_3)/T2_{AB}) \quad (18)$$

In contrast, $\Delta F_{BA}$ and $\Delta F_{BB}$ are represented by formulae (19) and by (20) respectively.

$$\Delta F_{BA}(t) = \Delta F_{BA}(t_1) \times \exp(-(t-t_1)/T2_{BA}) \quad (19)$$

$$\Delta F_{BB}(t) = \Delta F_{BB}(t_3) \times \exp(-(t-t_3)/T2_{BB}) \quad (20)$$

Here, the $\Delta F_{AA}$ in the formula (17) represents the tendency of decreasing the temperature distribution under the illumination condition A after the time t1, in a manner similar to $\Delta F_{AA}$ in the formulas (7) and (11). In contrast, the $\Delta F_{AB}$ in the formula (18) represents the tendency of decreasing the temperature distribution under the illumination condition B after the time $t_3$. The change amount $\Delta F_A$ is represented by the linear sum of these two models. Additionally, the $\Delta F_{BA}$ in the formula (19) represents the tendency of decreasing the temperature distribution under the illumination condition A after the time $t_1$, in a manner similar to $\Delta F_{BA}$ in the formulas (8) and (13). In contrast, the $\Delta F_{BB}$ in the formula (20) indicates the tendency of decreasing the temperature distribution under the illumination condition B after the time $t_3$. The change amount $\Delta F_B$ is represented by the linear sum of these two models.

Subsequently, each of the change amounts $\Delta F_A$ and $\Delta F_B$ in the section where the exposure processing is performed under the illumination condition A after the time $t_4$ ($t_4 < t$) is represented by formulas (21) and (22)

$$\Delta F_A(t) = \Delta F_{AA}(t) + \Delta F_{AB}(t) + \Delta F'_{AA}(t) \quad (21)$$

$$\Delta F_B(t) = \Delta F_{BA}(t) + \Delta F_{BB}(t) + \Delta F'_{BA}(t) \quad (22)$$

However, $\Delta F_{AA}$, $\Delta F_{AB}$, and $\Delta F'_{AA}$ are represented by formulae (23), (24), and (25) respectively.

$$\Delta F_{AA}(t) = \Delta F_{AA}(t_1) \times \exp(-(t-t_1)/T2_{AA}) \quad (23)$$

$$\Delta F_{AB}(t) = \Delta F_{AB}(t_3) \times \exp(-(t-t_3)/T2_{AB}) \quad (24)$$

$$\Delta F'_{AA}(t) = F1_{AA} \times (1 - \exp(-(t-t_4)/T1_{AA})) \quad (25)$$

In contrast, $\Delta F_{BA}$, $\Delta F_{BB}$, and $\Delta F'_{BA}$ are represented by formulae (26), (27), and (28) respectively.

$$\Delta F_{BA}(t) = \Delta F_{BA}(t_1) \times \exp(-(t-t_1)/T2_{BA}) \quad (26)$$

$$\Delta F_{BB}(t) = \Delta F_{BB}(t_3) \times \exp(-(t-t_3)/T2_{BB}) \quad (27)$$

$$\Delta F'_{BA}(t) = F1_{BA} \times (1 - \exp(-(t-t_4)/T1_{BA})) \quad (28)$$

Here, $\Delta F_{AA}$ in the formula (23) is identical to $\Delta F_{AA}$ in the formula (17). Similarly, $\Delta F_{AB}$ in the formula (24) is identical to $\Delta F_{AB}$ in the formula (18). In contrast, $\Delta F'_{AA}$ represents the tendency of increasing the temperature distribution under the illumination condition A after the time $t_4$. The change amount $\Delta F_A$ is represented by the linear sum of these three models. Note that $\Delta F'_{AA}$ and $\Delta F_{AB}$ in $t_4 \le t$ are shown by dashed lines in FIG. 6. $\Delta F_{BA}$ in the formula (26) is identical to $\Delta F_{BA}$ in the formula (19). Similarly, $\Delta F_{BB}$ in the formula (27) is identical to $\Delta F_{BB}$ in the formula (20). In contrast, $\Delta F'_{BA}$ represents the tendency of increasing the temperature distribution under the illumination condition A after the time $t_4$. The change amount $\Delta FE$ is represented by the linear sum of these three models.

Note that although the change amount $\Delta F_A$ represented by the formula (21) and the change amount $\Delta F_B$ represented by the formula (22) are respectively the sum of the three models, when the illumination condition is further changed and the exposure is continued, the number of models that take the sum increases, and the calculation formula for $\Delta F_A$ and $\Delta F_B$ becomes complicated. However, when the elapsed time from the time $t_1$ is sufficiently large with respect to the time constant $T2_{AA}$, that is, $(t-t_1) \gg T2_{AA}$, $\Delta F_{AA}$ can be regarded as zero. Accordingly, the section of $t_4 < t$ and $(t-t_1) \gg T2_{AA}$, $\Delta F_A$ can be represented by the sum of the two models represented by formula (29) based on the formula (21).

$$\Delta F_A(t) = \Delta F_{AB}(t) + \Delta F'_{AA}(t) \quad (29)$$

Similarly, in the section of $t_4 < t$ and $(t-t_1) \gg T2_{BA}$, $\Delta F_B$ can be represented by the sum of the two models represented by formula (30), based on the formula (22).

$$\Delta F_B(t) = \Delta F_{BB}(t) + \Delta F'_{BA}(t) \quad (30)$$

Thus, even when exposure is performed while changing the illumination conditions, it is not necessary to determine a model that represents the influence regarding all of the exposures performed in the past. If only the exposure performed within a time $T_L$ in the past influences the imaging performance, in the calculation of the change of the imaging performance at time t, only the influence of the exposure after the time $(t-T_L)$ needs to be taken into consideration and the complexity of the formula of the change amounts $\Delta F_A$ and $\Delta F_B$ can be suppressed. Here, the time $T_L$ may be optionally determined based on the accuracy requested for the calculation. For example, in a case where the error in calculations needs to be suppressed within 1% of the maximum change amount, the value of the time $T_L$ may be set to 4.5 to 5 times or more than the time constant T2.

Figure 7:
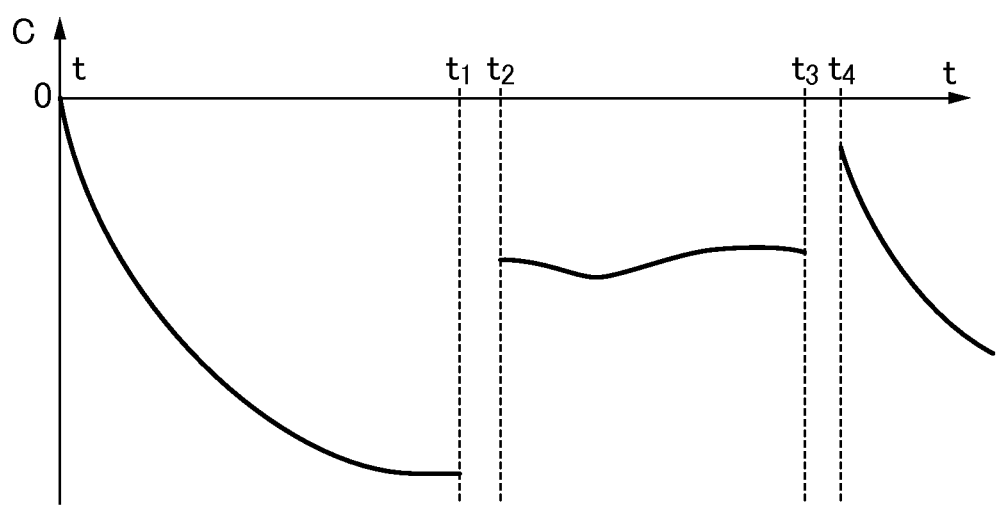
FIG. 7 is a graph illustrating a correction amount of the imaging performance in one embodiment.

Next, a description will be given of a correction method of the imaging performance of the projection optical system 110 in the present embodiment. FIG. 7 is a graph that illustrates a correction amount C of the imaging performance with respect to the imaging performance model shown in FIG. 6. In the section of $t_0 \leq t \leq t_1$ and $t_4 \leq t$, because the exposure processing is performed under the illumination condition A, the correction amount C is derived so as to offset the change amount $\Delta F_A$ of the imaging performance with respect to the illumination condition A. In contrast, in the section of $t_2 \leq t \leq t_4$, because the exposure processing is performed under the illumination condition B, the correction amount C is derived so as to offset the change amount $\Delta F_B$ of the imaging performance with respect to the illumination condition B. That is, the relation shown in formulae (31) to (33) is established.

$$t_0 \leq t \leq t_1 : C(t) = -\Delta F_A(t) \tag{31}$$

$$t_2 \leq t \leq t_3 : C(t) = -\Delta F_B(t) \tag{32}$$

$$t_4 \leq t : C(t) = -\Delta F_A(t) \tag{33}$$

The projection lens control device 114 derives the correction amount C as described above as the correction amount deriving process. Subsequently, the projection lens control device 114 drives the lens drive device 113 so as to change the imaging performance only by the correction amount C, and can offset the change of the imaging performance of the projection optical system 110. Note that if the reticle stage 109 or the wafer stage 116 is employed as a variable unit that makes the imaging performance of the projection optical system 110 variable instead of the lens drive device 113, for example, the main control device 103 executes the correction amount deriving process.

Note that in the sections $t_1 < t < t_2$ and $t_3 < t < t_4$, because the exposure processing is not performed, it is not necessary to correct the imaging performance. Additionally, in each section represented by the formulae (31) to (33), the change amount $\Delta F_B$ is used for the correction only in the section $t_2 \leq t \leq t_3$, and in other sections, it makes no contribution to the correction amount C, and therefore is not required. Accordingly, the projection lens control device 114 may determine $\Delta F_B$ at the time of $t_2$ for the first time based on the formula (8), without determining the change amount $\Delta F_B$ in the section, for example, $t_0 \leq t < t_2$. However, in the calculations for that case, the history information of the exposure performed in the past is required, and the projection lens control device 114 records the history information in advance. Moreover, the projection lens control device 114 may constantly perform the calculation of the change amount $\Delta F_B$, regardless of whether or not it contributes to the correction, and this is also applied to the change amount $\Delta F_A$.

Next, a description will be given of a method for acquiring parameters that specify the change of the imaging performance of the projection optical system 110 in the present embodiment, that is, parameters used for deriving the imaging performance model. Here, in order to specify the change of the imaging performance, four types of maximum change amount, $F1_{AA}$, $F1_{AB}$, $F1_{BA}$, and $F1_{BB}$ are required, and thus four types of $K_{AA}$, $K_{AB}$, $K_{BA}$, and $K_{BB}$ are also required for the change amount K of the imaging performance per unit light amount. Additionally, four types are similarly required for the time constants T1 and T2. To summarize the set of parameters, a first parameter includes $K_{AA}$, $T1_{AA}$, and $T2_{AA}$. Similarly, a second parameter includes $K_{AB}$, $T1_{AB}$, and $T2_{AB}$, a third parameter includes $K_{BA}$, $T1_{BA}$, and $T2_{BA}$, and a fourth parameter includes $K_{BB}$, $T1_{BB}$, and $T2_{BB}$.

Figure 8:
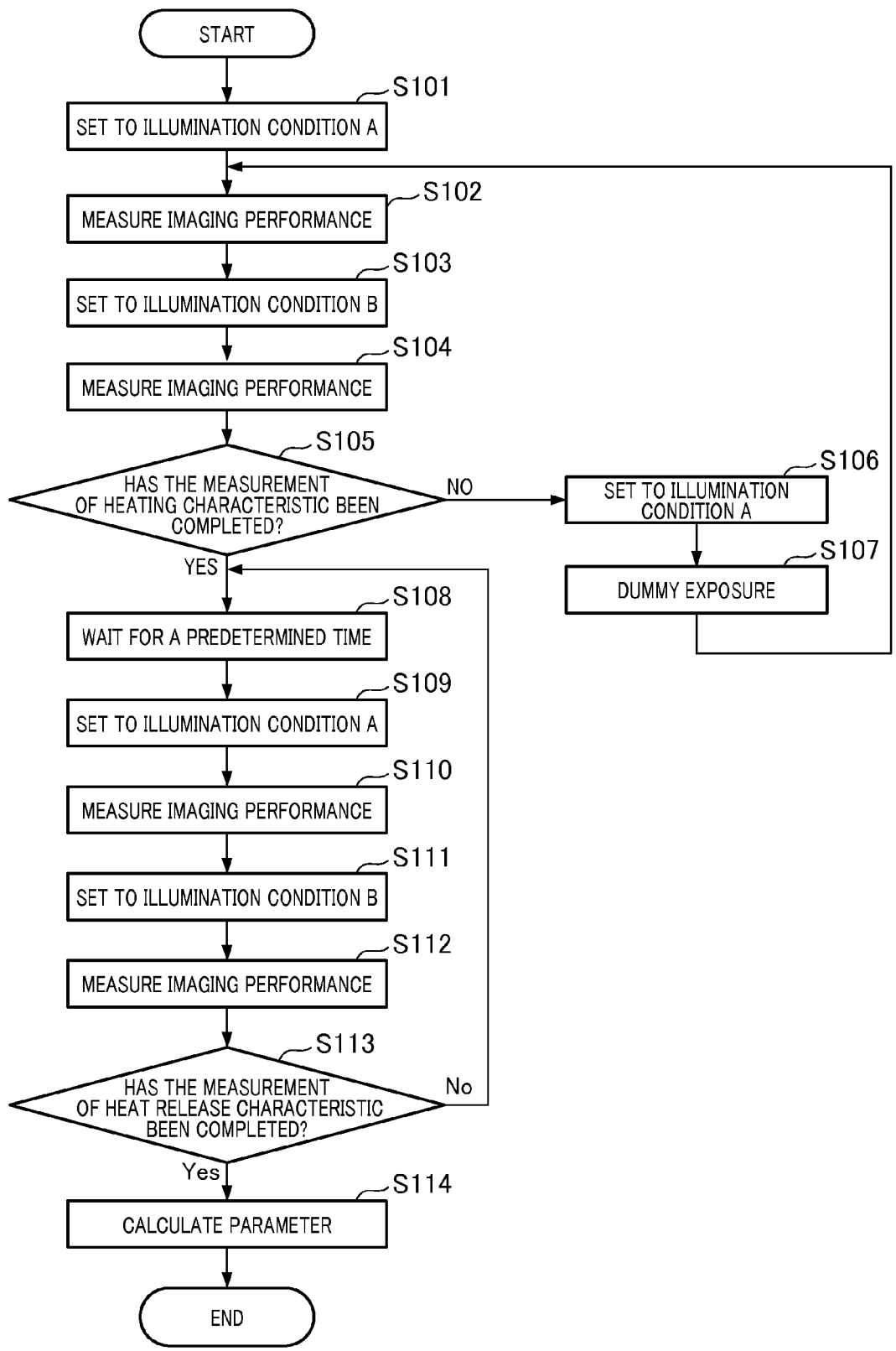
FIG. 8 is a flowchart illustrating a parameter acquisition process in one embodiment.
Figure 9:
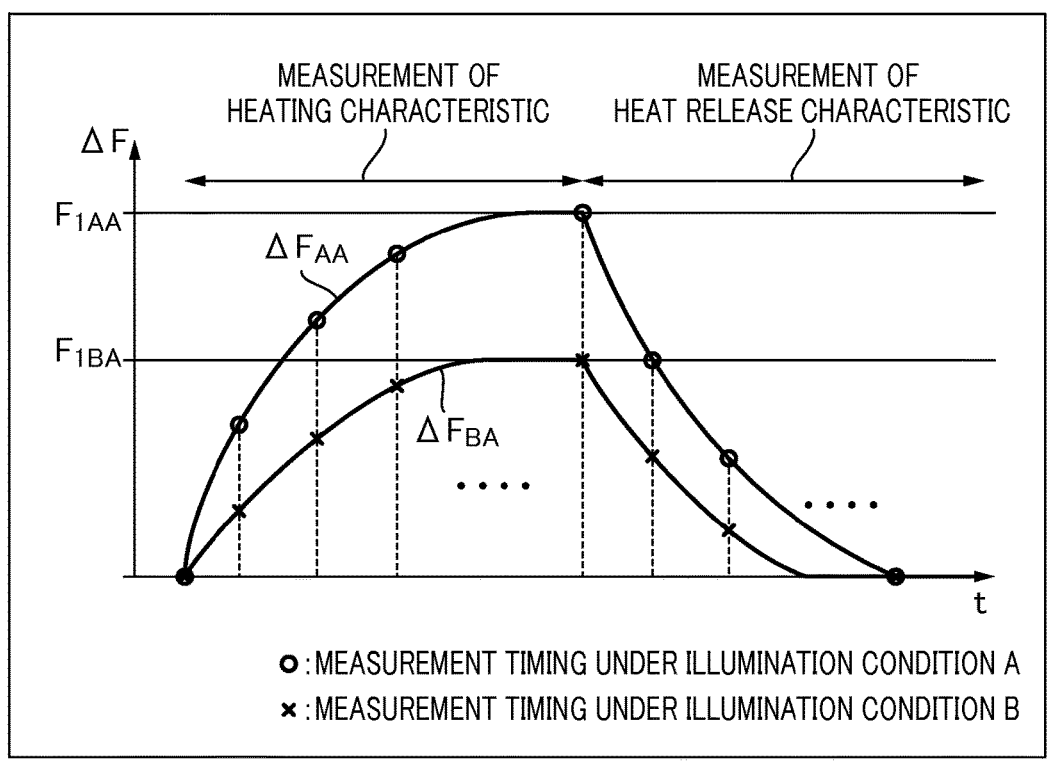
FIG. 9 is a graph illustrating measurement timing in the parameter acquisition process.

FIG. 8 is a flowchart that illustrates a flow of the acquisition process of parameters. Additionally, FIG. 9 is a graph that illustrates the change of the imaging performance of the projection optical system 110 during the acquisition process, and the timing of the imaging performance measurement included in the acquisition process. In FIG. 9, white circles indicate the timing for performing the imaging performance measurement under the illumination condition A, whereas, x-marks indicate the timing for performing the imaging performance measurement under illumination condition B. Note that, because of a state having no change in the imaging performance due to the exposure at the beginning of the acquisition process, $\Delta F_A = 0$, and $\Delta F_B = 0$.

In the beginning, the main control device 103 performs the measurement process related to the heating characteristic. First, the main control device 103 makes the illumination system control device 108 set the illumination condition to the illumination condition A (step S101). Next, the main control device 103 directs measuring the imaging performance under the illumination condition A (step S102). Here, as the measurement methods, for example, the pattern for the measurement is exposed onto the wafer W, and the line width and the like of the pattern are measured by separately using a measurement device, or they are directly measured by using a sensor (not illustrated) disposed on the wafer stage 116. At this time, it is desirable that the measurement time is sufficiently short with respect to the speed of change of the imaging performance, and an exposure energy irradiated to the projection optical system 110 is sufficiently small with respect to the exposure energy during dummy exposure in step S106, which is the subsequent step. Next, the main control device 103 makes the illumination system control device 108 set (switch) the illumination condition under the illumination condition B (step S103). Next, the main control device 103 directs measuring the imaging performance under the illumination condition B (step S104). Next, the main control device 103 determines whether or not the measurement process related to the heating characteristic will be ended, specifically, determines whether or not the measurement by the predetermined number of times has been ended (step S105). At this time, when the main control device 103 determines that the measurement has not ended by the predetermined number of times (NO), it again sets (switches) the illumination condition to the illumination condition A (step S106), and continuously directs performing the dummy exposure for a predetermined time (step S107). Here, the dummy exposure refers to exposure that irradiates the exposure light to the projection optical system 110 separately from the normal exposure, in order to provide a heat load to the projection optical system 110. That is, each measurement of the imaging performance under the illumination condition A or the illumination condition B related to the heating characteristic here is performed under the condition in which thermal load is provided under the illumination condition A. Subsequently, after the end of step S106, the main control device 103 returns to step S102, and repeats the imaging performance measurement, and the like. In contrast, in step S105, when the main control device 103 determines that the measurement has ended by the predetermined number of times (YES), the process is forwarded to the measurement process related to the subsequent heat release characteristic.

Next, the main control device 103 executes the measurement process related to the heat release characteristic. First, the main control device 103 waits for a predetermined time in a state in which light is not irradiated to the projection optical system 110 (step S108). Next, the main control device 103 directs repeating the setting of the illumination condition (switching) and the measurement of the imaging performance (steps S109 to S112) in a state similar to steps S101 to S104. Next, the main control device 103 determines whether or not the measurement process related to the heat release characteristic will end, and specifically, determines whether or not the measurement has ended by the predetermined number of times (step S113). At this time, when the main control device 103 determines that the measurement has not ended by the predetermined number of times (NO), the process returns to step S108, and the main control device 103 directs repeating the measurement of the imaging performance and the like. In contrast, in step S113, when the main control device 103 determines that the measurement has ended by the predetermined number of times (YES), the process proceeds to step S114.

Next, the main control device 103 executes the calculation process of parameter (step S114). At this time, the main control device 103 can calculate $K_{AA}$ and $T1_{AA}$ from the measurement results of the imaging performance under the illumination condition A in step S102, and can calculate $K_{BA}$, $T1_{BA}$ from the measurement results of the imaging performance under the illumination condition B in step S104. Additionally, the main control device 103 can calculate $T2_{AA}$ from the measurement results of the imaging performance under the illumination condition A in step S110, and can calculate $T2_{BA}$ from the measurement results of the imaging performance under the illumination condition B in step S112.

In contrast, if the main control device 103 executes a similar process after interchanging the illumination condition A and the illumination condition B in step S106 among processes shown in FIG. 8, the following parameters can also be calculated. Specifically, the main control device 103 can calculate $K_{AB}$ and $T1_{AB}$ from the measurement results of the imaging performance under the illumination condition A and can calculate $K_{BB}$ and $T1_{BB}$ from the measurement results of the imaging performance under the illumination condition B in the heating characteristic measurement process. Additionally, the main control device 103 can calculate $T2_{AB}$ from the measurement results of the imaging performance under the illumination condition A and can calculate $T2_{BB}$ from the measurement results of the imaging performance under the illumination condition B in the heat release characteristic measurement process. Subsequently, when the parameter calculation process of step S114 ends, the parameter acquisition process ends.

Note that a flow of the measurement process shown in FIG. 8 is an example of the determination of each measurement end in step S105 and step S113 may be determined based on whether or not the change of the measured imaging performance is saturated. Additionally, the heat release characteristic can be predicted from the measurement results related to the heating characteristic, instead of implementing the measurement related to the heat release characteristic of the subsequent step S108. For example, $T2_{AA}$ may be identical to the time constant $T1_m$ of the heating characteristic, instead of determining $T2_{AA}$ from the measurement results related to heat release characteristic.

Additionally, in the above description, a method for determining each parameter by the measurement of the imaging performance is exemplified. However, the present invention is not limited thereby, and for example, it may be possible that each parameter is determined by simulation in advance, and the change amount of the imaging performance is derived by using the acquired parameters.

Thus, in the exposure method according to the present embodiment, for example, in a case where exposure is continued while changing the illumination conditions, with respect to the change of the imaging performance of the projection optical system 110, a correction amount for correcting the imaging performance is determined by taking into consideration in advance not only the illumination condition at that time, but also the influence on other illumination conditions. Accordingly, in particular, it is possible to determine more accurately the correction value in the transient state where the influence under the illumination condition before the change and the influence under the illumination condition after the change overlap. Additionally, in the exposure method according to the present embodiment, it is not necessary to stop the exposure each time the illumination condition changes in order to eliminate the discontinuous state or transient state when illumination conditions are changed, so that exposure can be performed under a high-accuracy imaging performance without losing productivity.

As described above, according to the present embodiment, it is possible to provide the exposure method and the exposure apparatus that are advantageous in improving the exposure accuracy.

Note that, in the above description, although the case of switching between two types of illumination conditions is exemplified, it may be possible to switch among three or more types of illumination conditions. In that case, the exposure method similar to the above examples is applicable by increasing the number of models and the number of parameters that represent the influence on the imaging performance, depending on the number (type) of the illumination conditions. Here, the more the illumination condition increases, the more the number of models and the number of parameters increases, and then a configuration of the formula becomes complicated. Accordingly, in order to avoid complicating the configuration of the formula, the determination of the model and parameter is only targeted to a few typical illumination conditions. Subsequently, with respect to the other illumination conditions, it may be possible that a closer one is selected from among the typical illumination conditions, and the number of models and the number of parameters same as that are used. Alternatively, a plurality of closer ones from among the typical illumination conditions are selected, and the number of model and the number of parameter may be calculated by interpolation calculations.

(Article Manufacturing Method)

An article manufacturing method according to an embodiment of the present invention is preferred in manufacturing an article such as a micro device such as a semiconductor device or the like, an element or the like having a microstructure, or the like. The article manufacturing method may include a step of forming a latent image pattern on an object (e.g., exposure process) using the aforementioned exposure apparatus; and a step of developing the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-224877 filed Nov. 5, 2014, which is hereby incorporated by reference herein in its entirety.

What is claimed is:

1. An exposure method that performs exposure processing in which light from a light source is irradiated to an original, a pattern of the original is projected to a substrate via a projection optical system to expose the substrate, comprising:
   a first exposure step of performing the exposure processing by irradiating the projection optical system by a first pupil plane illumination distribution of the projection optical system;
   a second exposure step of performing the exposure processing by irradiating the projection optical system by the second pupil plane illumination distribution that is different from the first pupil plane illumination distribution, after the first exposure step;
   a change amount obtaining step of obtaining a change amount of an imaging performance of the projection optical system in a condition of the second pupil plane illumination distribution, with respect to the imaging performance of the projection optical system in the first exposure step in which the irradiation is performed in the first pupil plane illumination distribution; and
   a correction amount obtaining step of obtaining a correction amount for correcting the imaging performance of the projection optical system in the second exposure step, by using the change amount obtained in the change amount obtaining step,
   wherein, in the second exposure step, the exposure processing is performed by correcting the imaging performance of the projection optical system using the obtained correction amount.

2. The exposure method according to claim 1, wherein, in the change amount obtaining step, the change amount of the imaging performance is obtained by performing irradiation of the light under the condition of the first pupil plane illumination distribution, and measurement of the imaging performance of the projection optical system under the condition of the second pupil plane illumination distribution in a state in which temperature distribution is provided to the projection optical system by the irradiation of the light under the condition of the first pupil plane illumination distribution.

3. The exposure method according to claim 1, wherein, in the change amount obtaining step, the change amount of the imaging performance of the projection optical system under the condition of the second pupil plane illumination distribution, caused by the irradiation of the light under the condition of the first pupil plane illumination distribution is obtained by simulation.

4. The exposure method according to claim 1, wherein, in the correction amount obtaining step, the correction amount is obtained by using a third parameter that is acquired by performing the irradiation of the light under the condition of the first pupil plane illumination distribution and performing the measurement of the imaging performance under the condition of the second pupil plane illumination distribution, and by using a fourth parameter that is acquired by performing the irradiation of the light and the measurement of the imaging performance under the condition of the second pupil plane illumination distribution.

5. The exposure method according to claim 1, wherein, in the correction amount obtaining step, the correction amount is derived by using a first parameter that is acquired by performing the irradiation of the light and the measurement of the imaging performance under the condition of the first pupil plane illumination distribution, and by using a second parameter that is acquired by performing the irradiation of the light under the condition of the second pupil plane illumination distribution and performing the measurement of the imaging performance under the condition of the first pupil plane illumination distribution.

6. The exposure method according to claim 4, wherein, in the correction amount obtaining step, the correction amount applied during the second exposure step is derived by using the third parameter and the fourth parameter.

7. The exposure method according to claim 5, wherein, in the correction amount obtaining step, the correction amount applied during the second exposure step is derived by using at least either one of the first parameter or the second parameter.

8. The exposure method according to claim 4, wherein the third parameter and the fourth parameter each include at least one of a change amount of the imaging performance per unit light amount, a first time constant that indicates a speed of heating in an optical element included in the projection optical system, and a second time constant that indicates a speed of heat release from the optical element.

9. The exposure method according to claim 5, wherein the first parameter and the second parameter each include at least one of a change amount of the imaging performance per unit light amount, a first time constant that indicates a speed of heating in an optical element included in the projection optical system, and a second time constant that indicates a speed of heat release from the optical element.

10. The exposure method according to claim 1, wherein, in the correction amount obtaining step, the correction amount is derived taking into consideration only the influence of the exposure that was performed after a time determined based on an accuracy to be requested when the correction amount is derived.

11. The exposure method according to claim 1, wherein the imaging performance includes at least one of focus, magnification, distortion aberration, astigmatism, and field curvature.

12. A method of manufacturing an article, the method comprising steps of:
   exposing a substrate using an exposure method, and,
   developing the substrate exposed in the exposing,
   wherein the method is an exposure method that performs exposure processing in which light from a light source is irradiated to an original, a pattern of the original is projected onto the substrate via a projection optical system and exposed to the substrate, comprising:
   a first exposure step of performing the exposure processing by irradiating the projection optical system by a first pupil plane illumination distribution of the projection optical system;
   a second exposure step of performing the exposure processing by irradiating the projection optical system by the second pupil plane illumination distribution that is different from the first pupil plane illumination distribution, after the first exposure step;

a change amount obtaining step of obtaining a change amount of an imaging performance of the projection optical system in a condition of the second pupil plane illumination distribution, with respect to the imaging performance of the projection optical system in the first exposure step in which the irradiation is performed in the first pupil plane illumination distribution; and a correction amount obtaining step of obtaining a correction amount for correcting the imaging performance of the projection optical system in the second exposure step, by using the change amount obtained in the change amount obtaining step, wherein, in the second exposure step, the exposure processing is performed by correcting the imaging performance of the projection optical system using the obtained correction amount.

* * * * *